US007005728B1

(12) United States Patent
Li

(10) Patent No.: US 7,005,728 B1
(45) Date of Patent: Feb. 28, 2006

(54) LEAD CONFIGURATION FOR INLINE PACKAGES

(75) Inventor: Felix C. Li, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/861,166

(22) Filed: Jun. 3, 2004

(51) Int. Cl.
H01L 23/495 (2006.01)

(52) U.S. Cl. .................. 257/675; 257/666; 257/676; 257/787

(58) Field of Classification Search ............ 257/666, 257/675, 676, 787
See application file for complete search history.

(56) References Cited

U.S. PATENT DOCUMENTS

| 3,574,815 | A |   | 4/1971 | Segerson |         |
|-----------|---|---|--------|----------|---------|
| 4,032,706 | A |   | 6/1977 | Paletto  |         |
| 4,258,381 | A | * | 3/1981 | Inaba    | 257/666 |
| 4,451,973 | A |   | 6/1984 | Tateno et al. |    |
| 5,314,298 | A |   | 5/1994 | Kim      |         |
| 5,422,788 | A |   | 6/1995 | Heinen et al. |    |
| 5,434,750 | A | * | 7/1995 | Rostoker et al. | 361/784 |
| 6,114,750 | A | * | 9/2000 | Udagawa et al. | 257/666 |
| 6,215,662 | B1 |  | 4/2001 | Peter et al. |     |
| 6,291,262 | B1 |  | 9/2001 | Udagawa et al. |   |
| 6,399,415 | B1 |  | 6/2002 | Bayan et al. |     |
| 6,541,284 | B1 |  | 4/2003 | Lam      |         |

OTHER PUBLICATIONS

U.S. Appl. No. 10/831,537, entitled "Sawn Power Package and Method of Fabricating Same", by inventors: Hwa et al., filed Apr. 22, 2004.
National Semiconductor Corporation, Internal Document, entitled "Single-In-Line Flange Mounted", undated, one page.
National Semiconductor Corporation, Internal Document, entitled "TO-220, Molded, 5 Lead, Straight", dated Jan. 21, 2002, one page.
National Semiconductor Corporation, Internal Document, JEDEC Solid State Product Outlines, entitled "Plastic Thin Shrink Small Outline Package", dated May of 2001, 18 pages.
National Semiconductor Corporation, Internal Document, entitled "Molded TSSOP, JEDEC, EXP PAD, 5.0×4.4×0, 9mm BODY, 14 LD, 0.65mm PITCH", dated Feb. 12, 2003, one page.
National Semiconductor Corporation, Internal Document, entitled "Molded MINI-SO, .118×.118×.034 in BODY, 8 LD, 0.256 in PITCH", dated Nov. 18, 1996, one page.

* cited by examiner

Primary Examiner—Gene M. Munson
(74) Attorney, Agent, or Firm—Beyer Weaver & Thomas LLP

(57) ABSTRACT

A substrate for use in an inline IC package is designed such that its die attach pad and leads each have a number of protrusions and recesses. These protrusions and recesses create an irregular surface that provides better adhesion to encapsulant material than conventional leads and die attach pads, whose smooth, straight surfaces risk delamination of the encapsulant material.

18 Claims, 4 Drawing Sheets

LEAD CONFIGURATION FOR INLINE PACKAGES

BRIEF DESCRIPTION OF THE INVENTION

This invention relates to the packaging of integrated circuits (ICs). More specifically, this invention relates to the design of leads for use in inline IC packages.

BACKGROUND OF THE INVENTION

Current IC power packages, or those ICs designed to transport and/or regulate electrical power, are typically fabricated using a conductive lead-frame and leads surrounded by an encapsulant material, commonly a plastic. The encapsulant protects the IC and its integrated circuits from damage and environmental extremes, allowing such solid-state ICs to function in a robust manner. However, such packages suffer from various drawbacks.

As one example, it is known that the transport and control of electrical power can subject IC power packages to excessive thermal cycling as they heat up and cool down. As the encapsulant and leads often undergo differing rates of thermal expansion, stresses can build up at their interfaces, causing delamination of the encapsulant from the leads and other IC components. Such delamination allows moisture to enter the IC, which can corrode and/or short the package, and otherwise reduce performance. Connecting and disconnecting the IC also generates stresses along the length of the leads, adding to the risk of delamination.

It is therefore desirable to improve the integrity of the interface between an IC's encapsulant material and its other components. Such an improvement would extend the useful life of IC power packages, yielding more dependable operation and cost savings.

SUMMARY OF THE INVENTION

Broadly speaking, the invention pertains to leads and a die attach pad for use in inline power packages. The leads and/or die attach pad are configured with uneven edges, i.e., they are designed with protrusions and recesses that more securely adhere to encapsulant material, thus mitigating delamination and its accompanying problems. As an added advantage, such protrusions and recesses allow the leads to be placed closer to the die attach pad, allowing for shorter wire bonds and thus reducing any parasitic electrical effects. As a further added advantage, such a design also creates more sites for wirebonding to the leads, allowing adjacent wire bonds to be spaced farther apart so as to better avoid damage or interference.

The invention can be implemented in numerous ways, including as a method, system, device, or apparatus. Several embodiments of the invention are discussed below.

As an integrated circuit package, one embodiment of the invention comprises a die attach pad as well as a plurality of leads. Each plurality of leads has a first portion surrounding the first, second, and third sides of the die attach pad and a second portion extending from a first end of the package. Molding material at least partially encapsulates the die attach pad and the first portion of the plurality of leads. The first portion is substantially coplanar with the die attach pad. Also, each lead of the first portion has an upper surface configured for attachment to an electrical connector, and edges extending from the upper surface. The edges each have at least one protrusion and at least one recess, the protrusion and recess being configured to facilitate adhesion of the molding material to the plurality of leads.

As a lead-frame panel for use in semiconductor packaging, one embodiment of the invention comprises an array of device areas, each device area having a die attach pad with first, second, third, and fourth sides. Each device area also has a plurality of leads having a first portion that surrounds the first, second, and third sides of the die attach pad, and a second portion that extends to a first end of the lead-frame panel, the first portion being substantially coplanar with the die attach pad. Each lead has an upper surface configured for attachment to an electrical connector, and edges extending from the upper surface. The edges each have at least one protrusion and at least one recess, the protrusion and the recess configured to facilitate adhesion of a molding material to the leads.

As a method of packaging an integrated circuit die, one embodiment of the invention utilizes a lead-frame having a die attach pad with first, second, third, and fourth sides, and a plurality of leads. The plurality of leads has a first portion surrounding the first, second, and third sides of the die attach pad and a second portion extending to a first end of the lead-frame. This first portion is substantially coplanar with the die attach pad, and has upper surfaces configured for attachment to electrical connectors, as well as edges extending from the upper surfaces. The edges each have at least one protrusion and at least one recess, the protrusion and recess configured to facilitate adhesion of a molding material to the leads. A semiconductor die is attached to the device area, and electrical connectors are applied to the semiconductor die and the plurality of leads. The die attach pad and the sides of the first portion of the plurality of leads are then encapsulated with the molding material.

Other aspects and advantages of the invention will become apparent from the following detailed description taken in conjunction with the accompanying drawings which illustrate, by way of example, the principles of the invention.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

In one embodiment of the invention, a lead frame for use in an inline IC package is designed such that its die attach pad and leads each have a number of protrusions and recesses. These protrusions and recesses create an irregular surface that provides better adhesion to encapsulant material than conventional leads and die attach pads, whose smooth, straight surfaces risk delamination of the encapsulant material. Such a design provides additional benefits, such as the ability to design lead protrusions close to the die attach pad, where shorter bond wires can be used, thus reducing any parasitic inductance that may arise. Such protrusions and recesses also create more sites for wirebonding, allowing wire bonds to be spaced apart so as to better avoid damage or interference with adjacent wire bonds.

Figure 1:
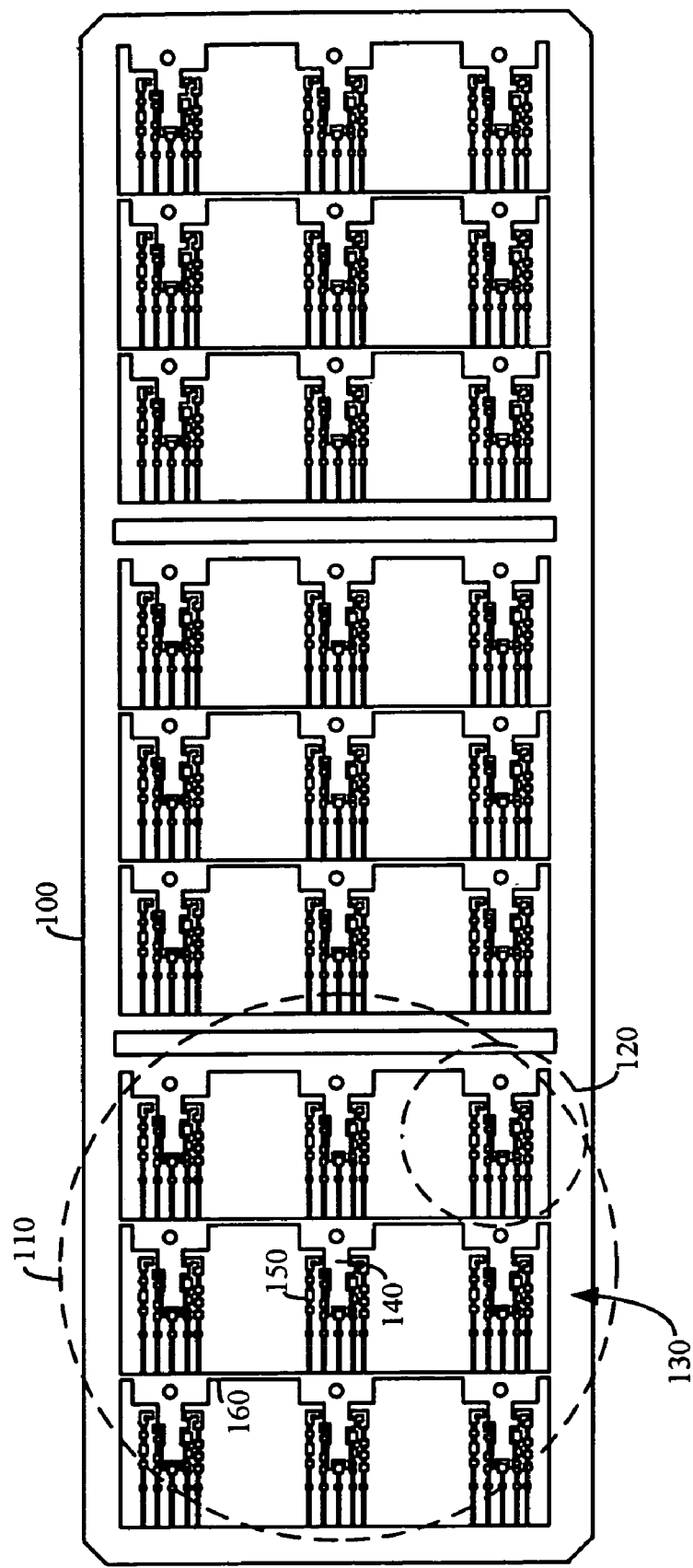
FIG. 1 illustrates a lead-frame having panels of device areas constructed in accordance with an embodiment of the invention.

FIG. 1 illustrates an example of a lead-frame having leads and die attach pads employing such protrusions and recesses. The lead-frame 100 has a number of two dimensional arrays 110, each having a number of device areas 120 arranged in columns 130. Each device area 120, in turn, has a die attach pad 140 for supporting a semiconductor die, and a plurality of leads 150 that are to be electrically connected to the die. In the leftmost and rightmost columns 130 of each array 110, leads 150 or die attach pads 140 are directly attached to the lead-frame 100. In intermediate columns 130, leads 150 and die attach pads 140 are attached to support rails 160 instead.

The lead-frame 100 shown, with its leads 150 and die attach pad 140 extending from opposite sides of each device area 120, is configured for use in inline power packages such as TO 220-type packages (i.e., those packages that conform to the TO 220 standard) and the like. One of skill will realize that the lead-frame 100 can thus be fabricated and packaged with known trim and forming techniques commonly employed to manufacture IC power packages. However, as an added advantage, the lead-frame 100 also has device areas 120 arranged in a generally flat two-dimensional array with each die attach pad 140 being substantially coplanar with its associated leads 150. In this arrangement, the lead-frame 100 is suitable for singulation by the same sawing equipment used in singulating surface mount packages such as QFN packages, as is described in the copending U.S. patent application entitled "Sawn Power Package and Method of Fabricating Same," filed on Apr. 22, 2004, invented by Hwa et al., and having a U.S. patent Ser. No. 10/831,537. The aforementioned application being incorporated by reference in its entirety. It should be noted that the invention encompasses device fabrication by any technique, including known trim and forming methods, the techniques described in the above-identified U.S. Patent Application, and any others. In lead-frames fabricated according to the techniques of the above-identified Patent Application, it is often beneficial to employ a thin lead-frame for ease of sawing. For example, a lead-frame 100 having a thickness of 0.008 inches or less can be employed, instead of the 0.015–0.050 inch thick lead-frames currently used in many power packages. This thinner lead-frame, which would result in leads 150 and die attach pads 140 having a uniform thickness of 0.008 inches or less, is easier to saw than current thicker lead-frames and can thus be manufactured more cheaply and efficiently.

Figure 2A:
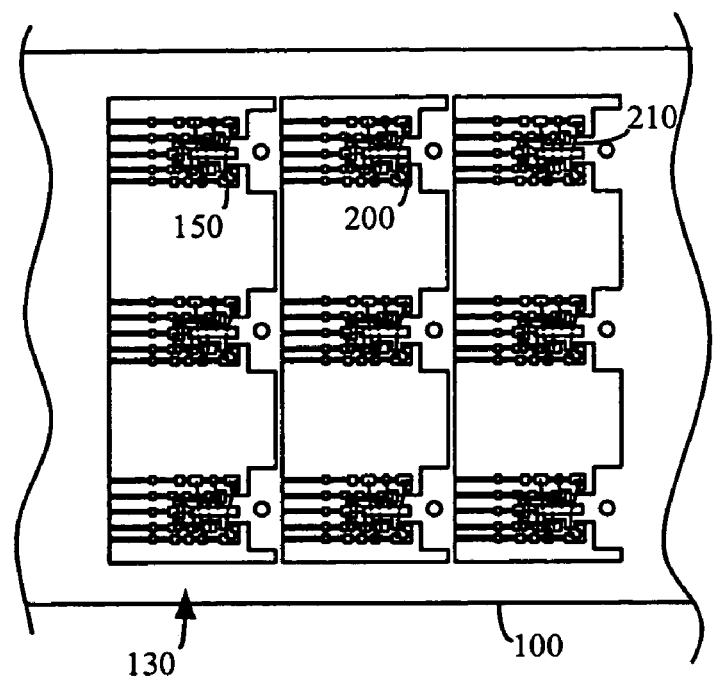
FIGS. 2A–B illustrate die attach, wire bonding, and encapsulation processes associated with the packaging of ICs in accordance with an embodiment of the invention.
Figure 2B:
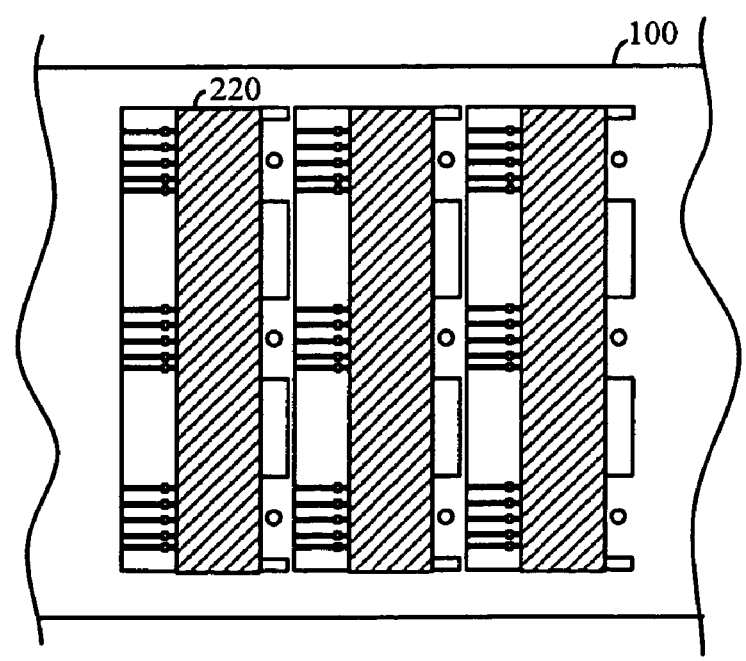

In operation then, power packages can be formed by subjecting the lead-frame 100 to conventional trim and forming techniques, where custom tooling is employed to punch out each encapsulated device area 120. However, packages can also be formed by employing cheaper and more flexible surface mount package fabrication processes. FIGS. 2A–B illustrate the application of such fabrication processes using the lead-frame 100. One or more semiconductor dice 200 are attached to each die attach pad 140 and electrically connected to respective leads 150 by bond wires 210. Once the dice 200 are wirebonded, columns 130 are encapsulated with an encapsulant material 220, and known gang-cutting saws cut the lead-frame 100 to singulate each package.

Figure 3:
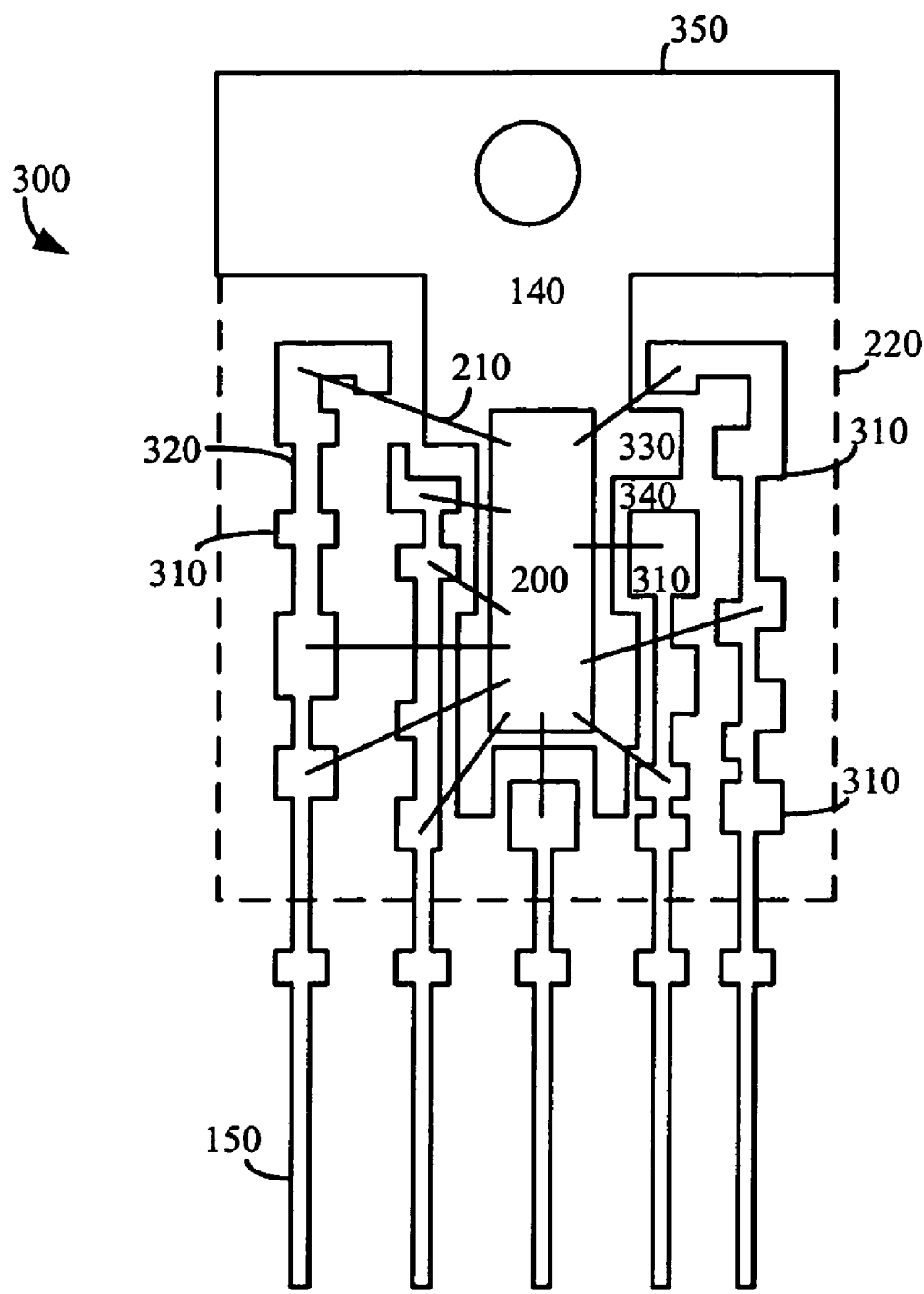
FIG. 3C illustrates a cutaway top view of an inline power package having leads and a die attach pad, both configured with protrusions and recesses in accordance with an embodiment of the invention.

Once the lead-frame 100 is singulated, the end result is an inline package embodying principles of the invention, as illustrated in FIG. 3. The package 300 is, from an external vantage point, a typical inline power package that conforms to any relevant power package standard such as the TO 220. For example, the package 300 has an encapsulant layer 220 (typically comprising a known molding material that protects the internal components of the package 300) and leads 150. However, within the package 300 are features that provide advantages not found in many current power packages. More specifically, the leads 150 extend to surround three sides of the die attach pad 140 (the fourth side being attached to a heat sink 350), and each have one or more protrusions 310 extending from the sides of the leads 150, and/or one or more recesses 320. Thus, instead of the "straight" leads found in current power packages, the package 300 has leads with irregular sides. These irregular sides (partly due to their increased surface area that creates a larger bond surface) provide for better adhesion to the encapsulant 220, preventing delamination of the encapsulant 220 from the leads 150 and die attach pad. In this manner, the protrusions 310 and recesses 320 create a more robust package 300 that is better able to withstand temperature cycles without risk of delamination and all its accompanying detrimental effects, such as moisture retention. The protrusions 310 and recesses 320 also serve to affix the leads 150 more securely along their major axis, i.e. along the length of the leads 150, preventing delamination and other damage caused by inserting a package 300 into, or removing it from, an electrical connector.

In similar fashion, the die attach pad 140 is also configured with protrusions 330 and recesses 340, so as to further improve the integrity of the bond between encapsulant 220 and die attach pad 140.

The protrusions 310 and recesses 320 provide additional benefits as well. For example, recesses 340 in the die attach pad 140 can be configured generally to align with protrusions 310 in the leads 150, allowing the protrusions 310 to extend closer to the die 200 than would otherwise be possible with conventional "straight-sided" leads and die attach pads. This allows for shorter bond wires 210, which is known to reduce the magnitude of detrimental effects such as parasitic inductance. As another example, protrusions 310, 330 provide convenient areas for attaching bond wires 210, allowing for additional wirebond sites. These sites can also be spaced apart so as to increase the spacing between bond wires 210, minimizing the risk of interference or contact between individual wires. As can be seen in FIG. 3, the bond wires 210 can be attached to differing protrusions 310, thus allowing for significant spacing between wires. As an additional benefit, protrusions 330 in the die attach pad 140 yield a die attach pad 140 with greater surface area, thus allowing for the use of larger dies 200. Finally, aligning the protrusions 310 of a lead 150 with the recesses 320 of an adjacent lead 150 allows adjacent leads 150 to be spaced closer together, allowing for smaller, more compact packages 300.

At this point, certain aspects of the invention are worth noting. First, it should be noted that the invention encompasses protrusions 310, 330 and recesses 320, 340 of any shape and dimension. For example, while the protrusions 310 and recesses 320 extend (or recede) at right angles to the leads 150, the invention encompasses embodiments in which this is not the case. Thus, protrusions 310 and recesses 320 can extend at various angles relative to the leads 150, and their profiles need not be "straight," i.e. the protrusions 310 and recesses 320 can have irregular sides that even further facilitate adhesion to the encapsulant 220. As another example, the invention encompasses leads 150 and die attach pads 140 that have any number of protrusions 310, 330 and recesses 320, 340, and not just the number shown in FIG. 3. Also, while it has been noted that it is sometimes advantageous to align protrusions 310, 330 with recesses 320, 340, this too is not required by the invention. Rather, the invention includes the arbitrary placement of protrusions with respect to recesses. Finally, one of skill will realize that the invention is not limited to the TO 220 type inline packages described. Instead, aspects of the invention can be employed to improve adhesion between the encapsulant material and leads of other single inline packages such as TSSOP packages, or other types of packages such as dual inline packages.

It is often of further advantage to include a heat sink to aid in further dissipation of heat during operation. To that end, a heat sink 350 can be included in the package 300, either as an extension of the die attach pad 140 (as shown in FIG. 3) or as a separate component.

Figure 4A:
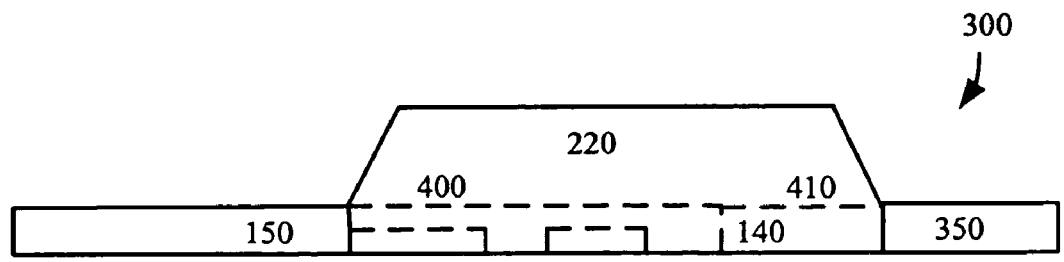
FIGS. 4A–B illustrate side and bottom views, respectively, of an encapsulated inline power package with an attached heat sink, that has been constructed in accordance with an embodiment of the invention.
Figure 4B:
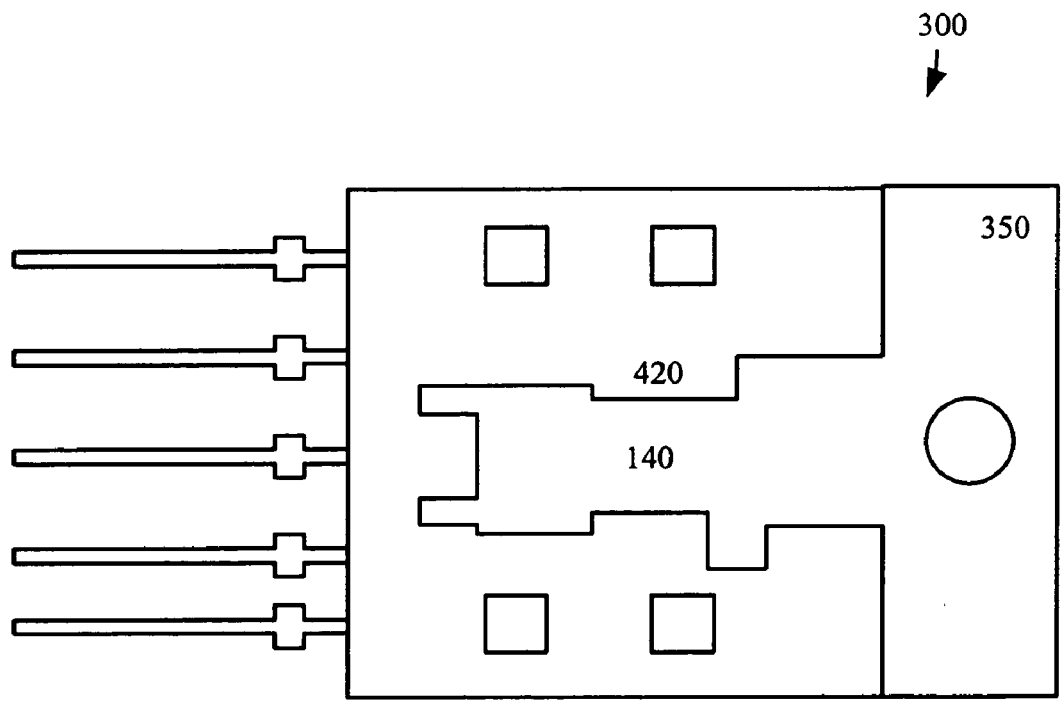

FIGS. 4A–B illustrate side and bottom views, respectively, of the package 300 of FIG. 3. The upper surfaces 400 and 410 of the leads 150 and die attach pad 140, respectively, can be substantially coplanar. This allows all components of the lead-frame 100 to be of substantially the same thickness, so as to facilitate ease of manufacture. While the leads 150 are shown as straight, one of skill will realize that the leads 150 can be formed to any shape. In connection with this fact, it should be recognized that various standards require power packages having varying dimensions and configurations. For example, some require leads 150 formed to a specific shape, while others require straight leads 150, and still others require leadless configurations in which the leads 150 do not extend past the encapsulant 220. The invention includes these and other configurations.

Similarly, the invention includes the dissipation of heat according to any configuration. While the heat sink 350 and die attach pad 140 are shown as completely exposed at the back surface 420 of the package 300, the invention includes configurations in which only portions of these components are exposed, either through selective half-etching or application of an insulator.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings. For example, lead-frames embodying principles of the invention can be configured for use in packages conforming to any standard, TO 220 or otherwise. Additionally, the leads 150 and die attach pad 140 can be configured with any number and shape of protrusions and/or recesses. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An integrated circuit package, comprising:
   a die attach pad having first, second, third, and fourth sides;
   a plurality of leads, each lead having a first portion positioned to the side of an associated one of the first, second, and third sides of the die attach pad and a second portion extending from a first end of the package, wherein the first portions of each lead are substantially coplanar with the die attach pad;
   a plurality of electrical connectors, each electrical connector electrically coupling the die to an upper surface of an associated lead; and
   molding material at least partially encapsulating the die attach pad, the electrical connectors and the first portions of each lead; and
   wherein each lead has at least one side extending protrusion and at least one side recess, the at least one protrusion and at least one recess configured to facilitate adhesion of the molding material to the plurality of leads.

2. The integrated circuit package of claim 1 wherein the at least one protrusion generally extends toward other ones of the leads or the die attach pad, and the at least one recess generally retracts away from other ones of the leads or the die attach pad, the at least one protrusion and at least one recess configured to facilitate adhesion of the molding material to the plurality of leads.

3. The integrated circuit package of claim 2 wherein at least some of the protrusions face and extend generally toward associated recesses in adjacent leads or the die attach pad.

4. The integrated circuit package of claim 1 wherein at least one of the sides of the die attach pad has at least one protrusion and at least one recess, and wherein each at least one protrusion of the die attach pad extends generally toward one at least one recess of one of the leads.

5. The integrated circuit package of claim 1 wherein the leads and the die attach pad each have a thickness of approximately 0.008 inches or less.

6. The integrated circuit package of claim 1 further comprising a heat sink extending from the fourth side of the die attach pad and in thermal communication with the die attach pad.

7. The integrated circuit package of claim 6 wherein the heat sink is substantially coplanar with the first portion and the die attach pad, and wherein the heat sink has a thickness of approximately 0.008 inches or less.

8. A lead-frame panel for use in semiconductor packaging, comprising:
   an array of device areas, each device area having:
      a die attach pad with first, second, third, and fourth sides; and
      a plurality of leads having a first portion that surrounds the first, second, and third sides of the die attach pad, and a second portion that extends to a first end of the lead-frame panel, the first portion being substantially coplanar with the die attach pad; and
   wherein each lead has an upper surface configured for attachment to an electrical connector, and edges extending from the upper surface, the edges each having at least one protrusion and at least one recess, the at least one protrusion and at least one recess configured to facilitate adhesion of a molding material to the leads.

9. The lead-frame panel of claim 8 wherein the edges each have at least one protrusion generally extending toward other ones of the leads or the die attach pad, and at least one recess generally retracting away from other ones of the leads or the die attach pad, the at least one protrusion and at least one recess configured to facilitate adhesion of the molding material to the plurality of leads.

10. The lead-frame panel of claim 9 wherein each at least one protrusion extends generally toward one at least one recess.

11. The lead-frame panel of claim 8 wherein at least one of the sides of the die attach pad has at least one protrusion and at least one recess, and wherein each at least one protrusion of the die attach pad extends generally toward one at least one recess of one of the leads.

12. The lead-frame panel of claim 8 wherein each of the die attach pads and each plurality of leads has a thickness of approximately 0.008 inches or less.

13. The lead-frame panel of claim 8 wherein each device area further comprises a heat sink extending from the fourth side of the die attach pad and in thermal communication with the die attach pad.

14. The lead-frame panel of claim 13 wherein each heat sink is substantially coplanar with the first portion and the die attach pads, and wherein each heat sink has a thickness of 0.008 inches or less.

15. An inline integrated circuit package, comprising:
a die attach pad having first, second, third, and fourth sides;
a first lead located proximate to and oriented generally parallel to the first side of the die attach pad;
a second lead located proximate to and oriented generally parallel to the first lead and the first side of the die attach pad, the second lead located between the first lead and the die attach pad;
a third lead located proximate to and oriented generally parallel to the second lead, and located proximate to and generally perpendicular to the second side of the die attach pad;
a fourth lead located proximate to and oriented generally parallel to the third lead and the third side of the die attach pad;
a fifth lead located proximate to and oriented generally parallel to the fourth lead, so that the fourth lead is located between the fifth lead and the die attach pad;
a semiconductor die attached to the die attach pad;
bond wires electrically connecting the semiconductor die to each of the leads; and
molding material at least partially encapsulating the die attach pad and each of the leads;
wherein each of the leads has an upper surface, a lower surface, sides extending therebetween, a plurality of tabs extending from the sides, and recessed areas between adjacent tabs, the plurality of tabs and the recessed areas configured to facilitate adhesion of the molding material to each of the leads.

16. The inline integrated circuit package of claim 15 wherein at least one of the leads has a tab extending generally toward the recessed area of an adjacent one of the leads.

17. The inline integrated circuit package of claim 15 wherein the first, second, and third sides of the die attach pad each have tabs extending toward the second, third, and fourth leads, respectively.

18. The inline integrated circuit package of claim 15 further comprising a heat sink extending from the fourth side of the die attach pad and in thermal communication with the die attach pad.

* * * * *